United States Patent
Doblinger et al.

(10) Patent No.: US 9,862,587 B2
(45) Date of Patent: Jan. 9, 2018

(54) DEVICE FOR FILLING A CONTAINER WITH A FILL PRODUCT

(71) Applicant: KRONES AG, Neutraubling (DE)

(72) Inventors: Josef Doblinger, Reichenbach (DE); Anton Hirschberger, Brennberg (DE); Christian Brey, Bad Abbach (DE); Florian Angerer, Suenching (DE); Stefan Poeschl, Sinzing (DE)

(73) Assignee: KRONES AG (DE)

( * ) Notice: Subject to any disclaimer, the term of this patent is extended or adjusted under 35 U.S.C. 154(b) by 17 days.

(21) Appl. No.: 14/880,002

(22) Filed: Oct. 9, 2015

(65) Prior Publication Data
US 2016/0101971 A1 Apr. 14, 2016

(30) Foreign Application Priority Data
Oct. 9, 2014 (DE) .......... 10 2014 114 641

(51) Int. Cl.
*B67C 3/28* (2006.01)
*B65B 3/00* (2006.01)
(Continued)

(52) U.S. Cl.
CPC .......... *B67C 3/28* (2013.01); *B65B 3/00* (2013.01); *B67C 3/00* (2013.01); *B67C 3/22* (2013.01);
(Continued)

(58) Field of Classification Search
CPC .... B67C 3/22; B67C 3/26; B67C 3/28; B67C 3/00; B65B 3/00; H05K 5/069; H05K 5/0247
(Continued)

(56) References Cited

U.S. PATENT DOCUMENTS

| 8,263,880 B2* | 9/2012 | Kraus | .......... H05K 5/0247 174/50 |
| 8,434,529 B2* | 5/2013 | Goldbrunner | .......... B67C 3/262 141/263 |

(Continued)

FOREIGN PATENT DOCUMENTS

| CN | 1942066 A1 | 4/2007 |
| CN | 102692624 | 9/2012 |

(Continued)

OTHER PUBLICATIONS

Extended European Search Report, Application No. 15189073.8, dated Mar. 17, 2016, 7 pages.

(Continued)

*Primary Examiner* — Nicolas A Arnett
(74) *Attorney, Agent, or Firm* — Haynes and Boone, LLP

(57) ABSTRACT

A device for filling a container with a fill product, for example, in a beverage filling plant, is described. The device includes a housing for accommodating an electronics module for controlling an electromechanical actuator of a filler valve, an electronics module accommodated in the housing, and at least one opening provided in the housing for feeding through an electrical contacting for the electronics module from outside the housing. The opening is sealed in a fluid-tight manner by a connecting device welded to the housing for feeding through the electrical contacting.

20 Claims, 3 Drawing Sheets

(51) Int. Cl.
*B67C 3/00* (2006.01)
*H05K 5/02* (2006.01)
*H05K 5/06* (2006.01)
*B67C 3/26* (2006.01)
*B67C 3/22* (2006.01)

(52) U.S. Cl.
CPC ............ *B67C 3/26* (2013.01); *H05K 5/0247* (2013.01); *H05K 5/069* (2013.01)

(58) Field of Classification Search
USPC .................... 141/98, 392; 137/382–382.5
See application file for complete search history.

(56) References Cited

U.S. PATENT DOCUMENTS

| | | | | |
|---|---|---|---|---|
| 8,702,450 | B2* | 4/2014 | Nass | H01R 13/504 |
| | | | | 439/606 |
| 8,944,117 | B2* | 2/2015 | Bertoni | B67D 1/0888 |
| | | | | 137/392 |
| 9,010,381 | B2* | 4/2015 | Clusserath | B67C 3/06 |
| | | | | 141/146 |
| 9,131,599 | B2* | 9/2015 | Motoori | H05K 5/0004 |
| 9,331,421 | B2* | 5/2016 | Lai | H01R 13/5202 |
| 9,474,168 | B2* | 10/2016 | Motoori | H05K 5/0004 |
| 2007/0072452 | A1* | 3/2007 | Inagaki | B60R 16/0239 |
| | | | | 439/76.2 |
| 2008/0079224 | A1* | 4/2008 | Thoms | H01R 13/5219 |
| | | | | 277/634 |
| 2009/0296355 | A1* | 12/2009 | Kraus | H05K 5/0247 |
| | | | | 361/728 |
| 2010/0099279 | A1* | 4/2010 | Homme | H01R 13/5202 |
| | | | | 439/78 |
| 2012/0031523 | A1 | 2/2012 | Bertoni et al. | |
| 2013/0308281 | A1* | 11/2013 | Motoori | H05K 5/0004 |
| | | | | 361/746 |
| 2015/0303766 | A1* | 10/2015 | Anderson | H05K 5/0247 |
| | | | | 310/71 |
| 2015/0334853 | A1* | 11/2015 | Motoori | H05K 5/0004 |
| | | | | 361/728 |

FOREIGN PATENT DOCUMENTS

| | | |
|---|---|---|
| CN | 203399453 | 1/2014 |
| DE | 20 2008 006 413 | 9/2009 |
| DE | 10 2011 006 195 | 10/2012 |
| EP | 1768475 | 3/2007 |
| EP | 2161790 | 3/2010 |
| GB | 1189787 | 4/1970 |
| JP | 2012-90481 | 5/2012 |

OTHER PUBLICATIONS

Search Report, dated Oct. 9, 2014, 7 pages, German Patent Application No. 10 2014 114 641.7.

* cited by examiner

DEVICE FOR FILLING A CONTAINER WITH A FILL PRODUCT

CROSS REFERENCE TO RELATED APPLICATION

This application claims priority from German Patent Application No. DE 10 2014 114 641.7, filed on Oct. 9, 2014 in the German Patent and Trademark Office, the disclosure of which is incorporated herein by reference in its entirety.

BACKGROUND

Technical Field

The present invention relates to a device for filling a container with a fill product, such as in a beverage filling plant, in which a housing for accommodating an electronics module is provided.

Related Art

From the state of the art, beverage filling plants are known in which filling elements for filling the containers that are to be filled with a fill product are provided, which are controlled by means of electromechanical actuators. The electromechanical actuators are each supplied with the appropriate control voltages or control currents by means of electronics modules, such that a specified opening and/or closing state of the corresponding filler valve in the filling element can be achieved.

The electronics modules, which are provided for controlling the electromechanical actuators in the filling elements, are usually disposed in central cabinets, which for example rotate together with a filler carousel, or else are disposed in a stationary position relative to a rotating filler carousel. In order to transmit the control signals, or the control and/or switching currents, to the applicable electromechanical actuators, cable feed-throughs through the applicable walls of the switching cabinets are provided.

In this it is known to pressurize such a switching cabinet to a slight overpressure, for example by means of compressed air, in order to ensure that no fluids, such as cleaning fluids, fill product or moisture from the air, can penetrate into the switching cabinet from outside and damage the electronics modules.

The known solution of a central switching cabinet with the known design is elaborate in terms of the establishment of the respective electrical connections, since the applicable cables must first be fed through the openings in the central switching cabinets, and the electronics modules must be contacted, then the cable feed-throughs must be sealed. Furthermore, the constant pressurization of the central switching cabinets with compressed air increases the operating costs of the associated beverage filling plant.

SUMMARY

A device for filling a container with a fill product which provides an improved construction is described.

Accordingly, a device for filling a container with a fill product in a beverage filling plant is proposed, comprising a housing for accommodating an electronics module for controlling an electromechanical actuator of a filler valve, an electronics module accommodated in the housing, and at least one opening provided in the housing for feeding through an electrical contacting for the electronics module from outside the housing. According to the present invention, the opening is sealed in a fluid-tight manner by a connecting device welded to the housing for feeding through the electrical contacting.

Due to the fact that the opening in the housing is sealed in a fluid-tight manner by a connecting device which is welded to the housing for feeding through the electrical contacting, simple contacting of the electronics module from outside the housing can be achieved. Furthermore, by means of the fluid-tight welding of the connecting device to the housing, a hermetically sealed feed-through of the electrical contacting can be achieved. If the housing and the connecting device are formed from a metallic material, it is also possible in this manner to achieve the grounding of the housing via the connector, with the result that additional measures to ground the housing are unnecessary. In a further example embodiment, grounding of the connecting device and the electronics module attached to it can also be achieved via the housing.

The welding of the connecting device into the opening of the housing further enables the assembly of the beverage filling plant, along with any maintenance that may be due, or replacement of the housing with the electronics module, to be performed in a simple manner, since there is no longer a need to feed cables through the housing walls and subsequently establish contact with the electronics module, or to seal the feed-through. Instead, the electrical contacting of the electronics module from outside is achieved by the direct connection of a suitable connecting device which is compatible with the connecting device that is fixedly welded to the housing.

Additionally, because of the fluid-tight seal, which is achieved by means of the welding of the connecting device to the housing, it is possible to dispense with the pressurizing of the housing with compressed air, or its impingement with a flow of compressed air, since hermetic sealing has been achieved.

The fluid-tight seal created by the welding in some embodiments has a weld seam that is produced by a laser welding process, for example using a low power pulsed laser. By this means the heat input to the connecting device is as low as possible, and corresponding heat damage to the connecting device can be avoided. In certain embodiments, the weld seam is produced in an I-joint, and is thus an I-seam. In contrast to a fillet joint, an I-joint has better heat input and heat dissipation, because less material is present in the area of the seam.

The connecting device is, in one embodiment, electrically connected with the electronics module, in order that contact can be made with the electronics module from outside.

In several embodiments, the connecting device is connected mechanically with the electronics module, and the electronics module is retained in the housing by means of the connecting device. By this means the welding of the connecting device into the opening of the housing can achieve not only the fully fluid-tight sealing of the housing, but also at the same time the retention of the electronics module in the housing. This provides not only secure and fluid-tight sealing of the housing in the area of the feed-through of the electrical contacting, but also simultaneously the secure attachment of the electronics module to the housing, as well as grounding. It is thus possible to dispense with other means of attachment for fixing the electronics module.

The connecting device, or a housing of the connecting device, is in certain embodiments formed from the same material as the housing for accommodating the electronics module. In this manner, problem-free and secure welding of the connecting device to the housing can be achieved. For this purpose, both the housing and the connecting device can be formed for example from a metal, for example a stainless steel, or a plastic. Further advantageous and fusion-weldable materials for forming a housing to accommodate an electronics module are also conceivable.

A particularly reliable seal is achieved if the connecting device is itself designed to be fluid-tight.

In several embodiments, the connecting device includes a flange to come into contact with an area of the housing that surrounds the opening, and on the opposite side of the housing a weld seam is provided for fluid-tight sealing and mechanical accommodation of the connecting device on the housing. In this way a mechanically reliable connection can be produced in a simple manner.

In a further embodiment of the device, a filling element is provided, which is operated by means of an electromechanical actuator. The housing for accommodating the electronics module is thereby disposed directly on the filling element or the electromechanical actuator. When a housing with a corresponding electronics module is disposed on every filling element of a beverage filling plant, it is accordingly possible to achieve a decentralized arrangement of the electronics modules. A central switching cabinet can either be dispensed with, or can be smaller. Furthermore, this arrangement omits the elaborate cabling from the central switching cabinet to each of the mechanical actuators.

The housing for accommodating the electronics module is in some embodiments designed as a self-contained module, such that it can be connected as a module with an electromechanical actuator, in order to enable the actuation of a filler valve in a filling element. The housing can accommodate not only the electronics module but also an electromechanical actuator, so that the housing with the electromechanical actuator and the electronics module can be disposed on a filling element, in particular a filler valve, and accordingly serve to actuate the filler valve. By means of the modular design, it becomes possible to replace the housing with the electronics module, and possibly the electromechanical actuator, as an entire module, and thereby, in the event of a defect in an individual filling element, restore the serviceability of the filling element in a simple manner by replacement of the drive module that is designed in this way.

With such a design, it is accordingly possible to dispense with time-consuming troubleshooting and time-consuming reconnection of electronic components with electromechanical actuators, as was necessary in the conventional arrangement with a central switching cabinet. Instead, the drive module can be simply connected merely by plugging in the connecting device.

In order to reduce or compensate for an equalization of mechanical stresses, which may for example occur due to the thermal expansion of the housing or the electronics module, a flexible element is in several embodiments provided between the connecting device and the electronics module. This can for example be achieved in that the electronics module is connected to the connecting device via extended-length pins, or a connection between the connecting device and the electronics module is provided by a cable, which is in one embodiment short, in the housing. The electronics module is then still retained on the housing by means of the connecting device, and in particular needs no additional fastening element in order to be attached to the housing. Instead, the retention of the electronics module then takes place via the flexible element on the connecting device, with the result that mechanical tensions can be reduced.

BRIEF DESCRIPTION OF THE FIGURES

Further embodiments and aspects of the present invention are more fully explained by the description below of the figures.

DETAILED DESCRIPTION

Examples of embodiments are described below with the aid of the figures. In the figures, elements which are identical or similar, or have identical effects, are designated with identical reference signs, and repeated description of these elements is in part dispensed with in the description below, in order to avoid redundancy.

Figure 1:
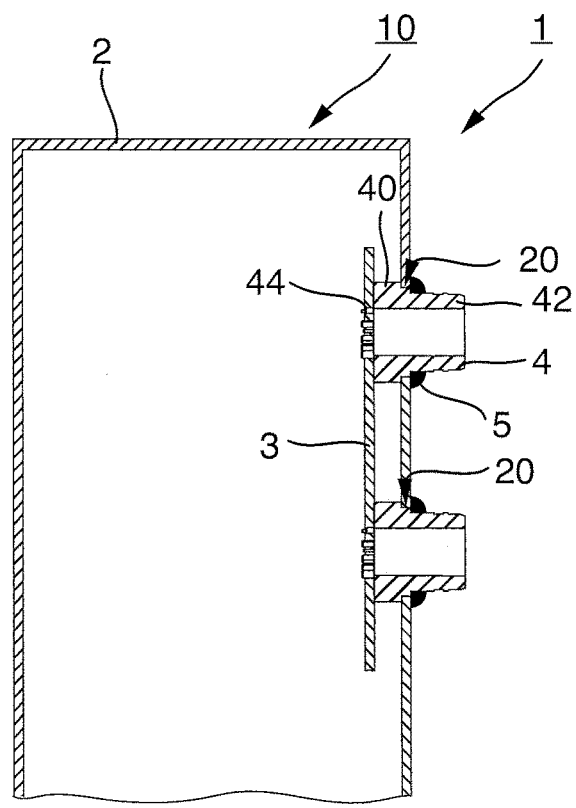
FIG. 1 is a schematic sectional view through a housing for accommodating an electronics module in a first example embodiment.

FIG. 1 shows schematically a portion of a device 1 for filling a container with a fill product in the form of a drive module 10 for driving a filler valve (which is not shown) in the device 1.

The device 1, and in particular the drive module 10, includes a housing 2 in which an electronics module 3 is accommodated. The electronics module 3 is here shown schematically in the form of a circuit board. The electronics module 3 can be for example a motor control for an electromechanical actuator which provides the necessary stroke lengths to drive the filler valve.

The housing 2 is in itself designed to be fluid tight, but has openings 20 through which the electronics module 3 can be contacted from outside the housing 2.

Every opening 20 accommodates a connecting device 4, which, in the example embodiment that is shown, is implemented as a socket for a plug. The connecting device 4 can however also be implemented as a plug; this depends on the connection system used in the device 1. The connecting device 4 is passed through the opening 20 such that its flange 40 comes into contact with an area of the inner surface of the housing 2 that surrounds the opening 20. In other words, the connecting device 4 cannot be pushed completely through the opening 20, but only until the flange 40 contacts the housing 2. The flange 40 accordingly has a greater diameter than the opening 20.

The opening 20 and the connecting device 4, or its connecting device housing 42, in some embodiments have a circular cross-section, so that the opening 20 can be implemented as a drilled hole.

The connecting device 4 is welded to the housing 2 in a fluid-tight manner. A weld seam 5 can accordingly be seen, which is provided on the outside of the housing 2, and which extends around the opening 20 and the connecting device 4. By this means the connecting device 4 is mechanically retained securely in the opening 20 of the housing 2, and is at the same time also sealed in a fluid-tight manner.

Due to the welding, not only is the connecting device 4 retained in a fluid-tight and fixed manner in the opening 20 of the housing 2, but there is also a material-locked connection between the connecting device 4 and the housing 2. The connecting device 4 can therefore not be detached by vibration or other mechanical influences from the housing 2, which it seals fluid-tight. The connecting device 4 has itself already been implemented in a fluid-tight manner, and acts in effect as a stopper for the opening 20.

The connecting device 4, and in particular the connecting device housing 42, is in several embodiments formed from the same material as the housing 2. The connecting device housing 42 can for example be formed from a metal, particularly a stainless steel. The housing 2 is then formed from the same material. Accordingly, the weld seam 5 can produce a reliable material-locked connection between the connecting device 4 and the housing 2. Alternatively, the housing 2 and the connecting device 4 can be formed from a plastic material.

Alternatively, in some embodiments, the fluid-tight seal produced by the welding has a weld seam that was produced by a laser welding process, for example using a low power pulsed laser. By this means the heat input to the connecting device is as low as possible, and heat damage to the connecting device can thus be avoided. In some embodiments, the weld seam is produced in an I-joint, and is thus an I-seam. In contrast to a fillet joint, an I-joint has better heat input and heat dissipation, because not as much material is present in the area of the seam.

The electronics module 3 in the form of a circuit board is contacted electrically via connection pins 44 of the connecting device 4. Accordingly, a plug-in contact introduced into the connecting device 4 from outside the housing 2 can be placed in electrical contact with the electronics module 3 via the connection pins 44. Because the connecting device 4 is accommodated in the housing 2 such as to form a fluid-tight seal, however, and additionally the connecting device 4 is itself designed to be fluid-tight, the interior of the housing 2 is reliably insulated in a fluid-tight manner from the exterior.

The electronics module 3 is however fixedly retained on the connecting device 4 by means of the connection pins 44. In other words, the connecting device 4 is mechanically fixedly connected with the electronics module 3 such that when the connecting device 4 is subsequently welded together with the housing 2, the electronics module 3 is also fixedly retained mechanically on the housing 2. Thus the electronics module 3 is fixedly connected with the housing 2 via the connecting device 4. It is therefore unnecessary to provide further fastening elements or fastening means for retaining the electronics module 3 on the housing 2, and it is retained on the housing 2 only via the connecting device 4.

Figure 2:
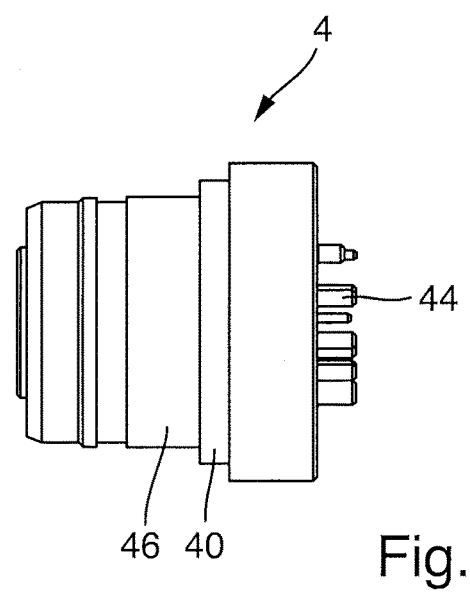
FIG. 2 is a schematic side view of a connecting device.

FIG. 2 shows schematically a connecting device 4, which can be inserted in an opening 20 of the housing 2. The connecting device 4 has connection pins 44, which can be placed in electrical contact with the corresponding electronics module, which is not shown in FIG. 2. As well as the electrical contact, a mechanical connection between the connecting device and the electronics module 3 can be produced by means of the fixing of the electronics module 3 to the connecting device 4. For example, the connection pins 44 can be fed through complementary openings in the electronics module 3, and then soldered, glued or bonded to the electronics module. The electronics module 3 can thus be electrically contacted and mechanically fixedly retained on the connecting device 4.

Also visible is the flange 40, which can come into contact with the area of the housing around the opening 20 of the housing 2. A feed-through section 46 of the connecting device housing 42 adjoins the flange 40. This feed-through section 46 is fed through the opening 20 in the housing 2, and then serves, in the section with which it extends through the opening 20 in the housing 2, to make contact with a plug, or a corresponding cable for electrical connection, that is led to it from outside the housing 2.

Figure 3:
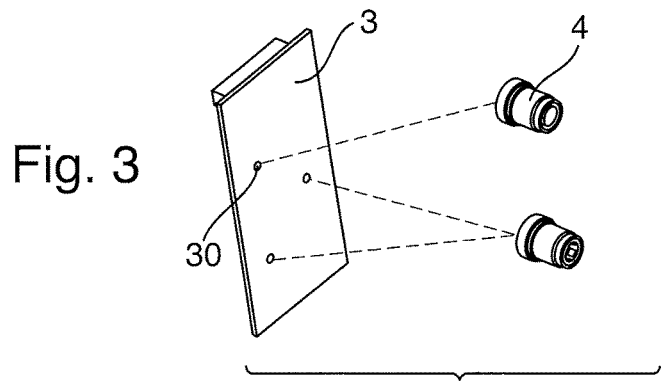
FIG. 3 is a schematic perspective representation of an electronics module and connecting devices that are to be attached to it.
Figure 4:
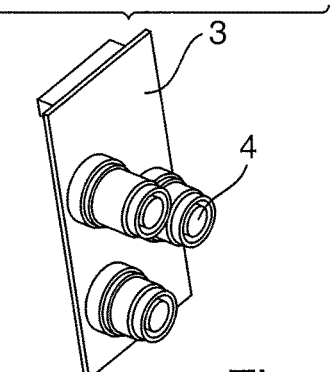
FIG. 4 is the electronics module of FIG. 3 with the connecting devices attached to it.

FIGS. 3 and 4 show schematically how a connecting device 4 can be brought into engagement with corresponding recesses 30 in the electronics module 3, with which it can be fixedly attached and placed in electrical contact, for example by means of soldering or adhesion.

FIG. 4 correspondingly shows an electronics module 3 with three attached connecting devices 4. The connecting devices 4 are sufficiently firmly fixed to the electronics module 3 that the electronics module 3 can be retained by means of the connecting devices 4.

Figure 5:
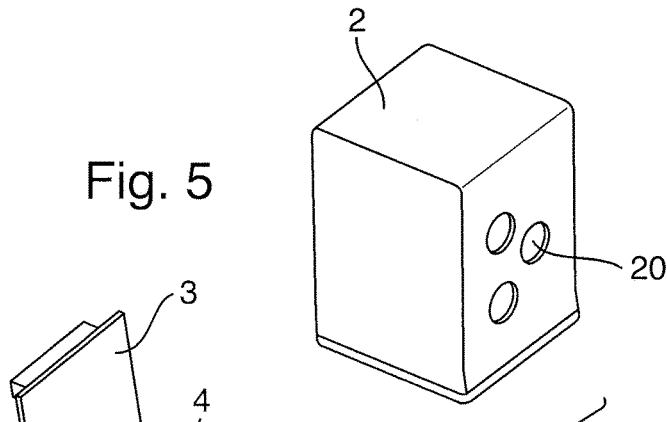
FIG. 5 is a schematic perspective representation of the process of inserting the electronics module in a housing.
Figure 6:
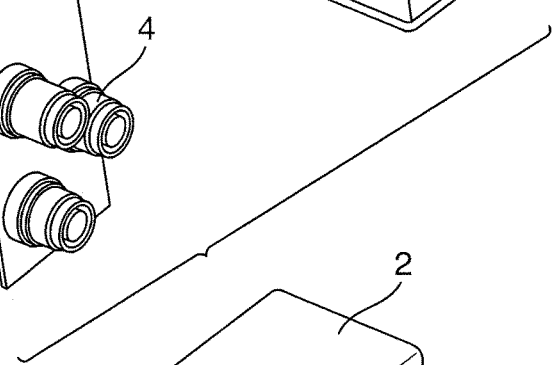
FIG. 6 is a schematic perspective representation of the housing with the connecting devices, upon which the electronics module is retained, inserted.
Figure 6:
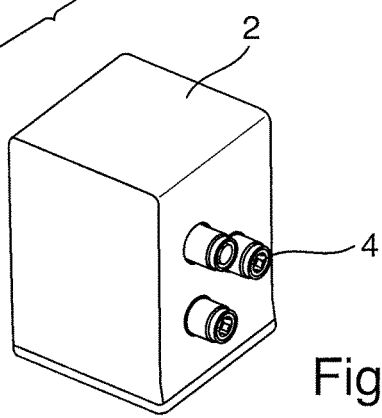

FIG. 5 shows schematically how the electronics module 3 with the associated connecting devices 4 can be introduced into a suitable housing 2 in which openings 20 are provided. This firstly enables a sealed feed-through of an electrical contacting of the electronics module 3, and secondly retains the electronics module 3 in the housing 2. FIG. 6 shows the corresponding assembled state of the housing 2, with the connecting devices 4 installed in it and welded.

In order to reduce or compensate for an equalization of mechanical stresses, which may for example occur due to the thermal expansion of the housing 2 or the electronics module 3, a flexible element may be provided between the connecting device 4 and the electronics module 3.

This flexible element can be provided, for example, by extended-length pins in the connecting device 4, or by a short cable between the connecting device 4 and the electronics module 3. The electronics module 3 is then still retained on the housing 2 by means of the connecting device 4, and in particular needs no additional fastening element in order to be attached to the housing 2. Instead, the retention of the electronics module 3 then takes place via the flexible element on the connecting device 4, with the result that mechanical tensions can be reduced.

Figure 7:
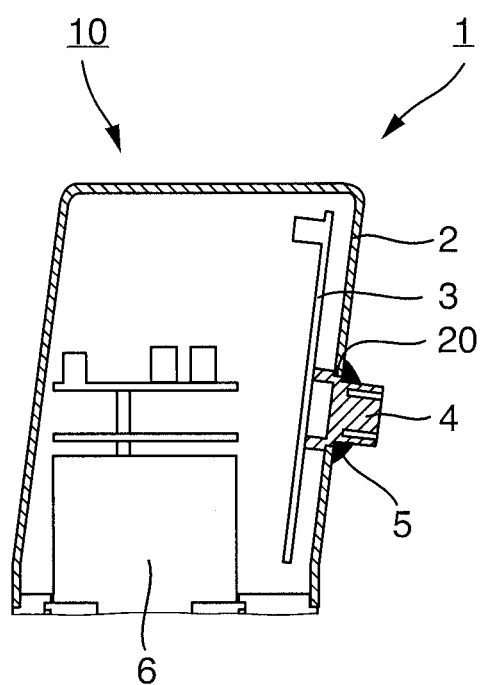
FIG. 7 is a schematic sectional view through a housing enclosing an electronics module and an electromechanical actuator.

FIG. 7 shows schematically a sectional view through a device 1, in which a connecting device 4 is welded via a weld seam 5 into a corresponding opening 20 in a housing 2. On the rear side of the connecting device 4, which is oriented towards the interior of the housing 2, an electronics module 3 in the form of a circuit board is attached. By this means both the feed-through for the electrical contact means of the electronics module 3 is provided, and secure retention of the electronics module 3 is achieved.

The housing 2 also accommodates an electromechanical actuator 6, which is controlled by the electronics module 3, and which can drive a filler valve such that the filler valve can be opened and closed.

The housing 2 can thus be implemented as a complete drive module 10, which includes a self-contained drive module 10 with an electromechanical actuator 6 and an electronics module 3 which controls the electromechanical actuator 6. In the drive module 10 a gear unit can also be provided, which can then be coupled with the tappet of the filler valve.

By means of the provision of the drive module 10 in this form it is possible for a drive, which includes both an electromechanical actuator 6 and the electronics module 3 that is associated with the electromechanical actuator 6, to be accommodated in a housing 2 in a secure and fluid-tight manner. The drive module 10 as a whole can thus be provided decentrally on each individual filling element, and controlled simply via a central control unit. The associated feed-through of the control lines or electrical contact means is thereby effected by the fluid-tight disposition of the connecting device 4.

Accordingly, when a filling element in a beverage filling plant fails to operate due to electronic problems or drive problems, the drive module 10 can be replaced as a whole, and connected simply by connecting a complementary plug to the connecting device 4, and connecting the drive module 10 mechanically with the filling element or the filler valve. Thus it is unnecessary to carry out time-consuming troubleshooting. Instead, the drive module 10 is simply replaced if it has a defect in its electronics or electromechanical actuator. No complicated troubleshooting is therefore necessary, and the replacement or maintenance can also be performed by less specialized operating staff.

To the extent applicable, all individual features described in the individual example embodiments can be combined with each other and/or exchanged, without departing from the field of the invention.

The invention claimed is:

1. A device for filling a container with a fill product, comprising:
    an electromechanical actuator of a filler valve;
    an electronics module that controls the electromechanical actuator;
    a first housing that accommodates the electronics module and the electromechanical actuator;
    at least one opening provided in the first housing through which the electronics module can be contacted from outside the first housing; and
    a connecting device attached to the first housing, wherein the at least one opening is sealed by the connecting device.

2. The device of claim 1, wherein the connecting device is electrically connected to the electronics module.

3. The device of claim 1, wherein the connecting device is connected mechanically to the electronics module, and the electronics module is retained in the first housing by the connecting device.

4. The device of claim 1, wherein the connecting device and the first housing are formed of the same material.

5. The device of claim 4, further comprising a second housing for the connecting device formed of a same material as the first housing that accommodates the electronics module.

6. The device of claim 4, wherein the material comprises a metal or a plastic.

7. The device of claim 6, wherein the metal comprises a stainless steel.

8. The device of claim 1, wherein the connecting device comprises a flange that comes into contact with an area of the first housing that surrounds the opening, and the device further comprises a weld seam on the opposite side of the first housing for fluid-tight sealing and mechanical accommodation of the connecting device attached to the first housing.

9. The device of claim 1, wherein the first housing forms a drive module, which is connectable to a filler valve.

10. The device of claim 1, further comprising at least two filling elements, each of which is provided with a drive module.

11. The device of claim 1, wherein the connecting device is connected to the electronics module via a flexible element.

12. The device of claim 11, wherein the flexible element comprises extended-length pins in the connecting device or a cable between the connecting device and the electronics module.

13. The device of claim 1, wherein the connecting device comprises connection pins.

14. The device of claim 13, wherein the electronic module is retained on the connecting device by the connection pins.

15. A device for filling a container with a fill product, comprising:
    an electromechanical actuator of a filler valve;
    an electronics module that controls the electromechanical actuator, wherein the electronics module comprises a circuit board;
    a first housing that accommodates the electronics module and the electromechanical actuator;
    at least one opening provided in the first housing that feeds through an electrical contact for the electronics module from outside the first housing; and
    a connecting device welded to the first housing via a weld seam into the at least one opening, wherein the opening is sealed by the connecting device.

16. The device of claim 15, wherein the connecting device comprises a socket for a plug or a plug.

17. The device of claim 15, wherein the electronics module is contacted electrically via connection pins of the connecting device.

18. The device of claim 15, wherein the first housing forms a drive module, which is connectable to a filler valve.

19. The device of claim 15, wherein the first housing provides grounding of the connecting device and the electronics module.

20. The device of claim 15, wherein the connecting device is connected mechanically to the electronics module, and the electronics module is retained in the first housing by the connecting device.

* * * * *